US012746853B2

(12) United States Patent
Tsai et al.

(10) Patent No.: US 12,746,853 B2
(45) Date of Patent: Sep. 29, 2026

(54) ELECTRIC ENERGY MANAGING SYSTEM AND METHOD THEREOF

(71) Applicant: INDUSTRIAL TECHNOLOGY RESEARCH INSTITUTE, Hsinchu (TW)

(72) Inventors: Tsu-Yang Tsai, Kaohsiung City (TW); Ming-Hao Wang, Hsinchu City (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 19/098,830

(22) Filed: Apr. 2, 2025

(65) Prior Publication Data

US 2026/0167059 A1 Jun. 18, 2026

(30) Foreign Application Priority Data

Dec. 18, 2024 (TW) ................................ 113149440

(51) Int. Cl.
*B60L 58/40* (2019.01)
*B60L 58/16* (2019.01)
(Continued)

(52) U.S. Cl.
CPC ............... *B60L 58/40* (2019.02); *B60L 58/16* (2019.02); *G01R 31/367* (2019.01);
(Continued)

(58) Field of Classification Search
CPC ....... B60L 58/40; B60L 58/16; G01R 31/392; H01M 8/04388; H01M 8/04925;
(Continued)

(56) References Cited

U.S. PATENT DOCUMENTS 9,969,297 B2 5/2018 Ramaswamy et al.
2005/0123811 A1* 6/2005 Gottwick .......... H01M 8/04089 429/444

(Continued)

FOREIGN PATENT DOCUMENTS

CN 110311421 A * 10/2019 ................ H02J 3/46
CN 108417868 B 4/2020

(Continued)

OTHER PUBLICATIONS

Taiwanese Office Action for Taiwanese Application No. 113149440, dated Jun. 26, 2025.

(Continued)

*Primary Examiner* — Taelor Kim
*Assistant Examiner* — Duc M Pham
(74) *Attorney, Agent, or Firm* — Birch, Stewart, Kolasch & Birch, LLP

(57) ABSTRACT

An electric energy managing system applied to an electric vehicle, comprises the following components. A first state-of-health (SOH) calculating circuit, calculates an overall SOH of a fuel cell of the electric vehicle. The overall SOH is associated with an aging condition of the fuel cell. A second SOH calculating circuit, calculates a SOH of a lithium battery of the electric vehicle. The SOH is associated with an aging condition of the lithium battery. An electric energy distribution circuit, calculates a first predefined ratio of an output power of the fuel cell with respect to a total electric energy demand of the electric vehicle according to the overall SOH of the fuel cell and the SOH of the lithium battery, and controls a second predefined ratio of the output power of the fuel cell with respect to an output power of the lithium battery according to the first predefined ratio.

18 Claims, 10 Drawing Sheets

(51) Int. Cl.

| | |
|---|---|
| ***G01R 31/367*** | (2019.01) |
| ***G01R 31/3835*** | (2019.01) |
| ***G01R 31/392*** | (2019.01) |
| ***H01M 8/0438*** | (2016.01) |
| ***H01M 8/0444*** | (2016.01) |
| ***H01M 8/04492*** | (2016.01) |
| ***H01M 8/04537*** | (2016.01) |
| ***H01M 8/04858*** | (2016.01) |
| ***H01M 8/04992*** | (2016.01) |
| ***H01M 10/052*** | (2010.01) |
| ***H01M 10/42*** | (2006.01) |
| ***H01M 10/48*** | (2006.01) |
| ***H01M 16/00*** | (2006.01) |
| ***H02J 7/34*** | (2006.01) |

(52) U.S. Cl.

CPC ....... *G01R 31/3835* (2019.01); *G01R 31/392* (2019.01); *H01M 8/04388* (2013.01); *H01M 8/04447* (2013.01); *H01M 8/04492* (2013.01); *H01M 8/04544* (2013.01); *H01M 8/04626* (2013.01); *H01M 8/04925* (2013.01); *H01M 8/04992* (2013.01); *H01M 10/052* (2013.01); *H01M 10/425* (2013.01); *H01M 10/48* (2013.01); *H01M 16/006* (2013.01); *H02J 7/34* (2013.01); *H01M 2220/20* (2013.01); *H01M 2250/20* (2013.01); *H01M 2250/402* (2013.01)

(58) Field of Classification Search

CPC ............. H01M 10/052; H01M 10/425; H01M 16/006; H02J 7/34

See application file for complete search history.

(56) References Cited

U.S. PATENT DOCUMENTS

| | | | | |
|---|---|---|---|---|
| 2010/0129690 | A1* | 5/2010 | Uemura ............ | H01M 8/04888 320/152 |
| 2023/0216074 | A1 | 7/2023 | Kim et al. | |
| 2023/0402659 | A1 | 12/2023 | Kim et al. | |
| 2024/0072274 | A1 | 2/2024 | Blomgren et al. | |
| 2024/0157850 | A1 | 5/2024 | Kumaraswamy et al. | |
| 2024/0178419 | A1 | 5/2024 | Kim et al. | |
| 2024/0262255 | A1 | 8/2024 | Farber et al. | |
| 2025/0190649 | A1* | 6/2025 | Converse ............... | G05B 17/02 |

FOREIGN PATENT DOCUMENTS

| | | | | | |
|---|---|---|---|---|---|
| CN | 113419425 | A | * | 9/2021 | ........... G05B 13/042 |
| CN | 113428049 | A | | 9/2021 | |
| CN | 114379386 | A | * | 4/2022 | .............. B60L 50/40 |
| CN | 115649089 | A | | 1/2023 | |
| CN | 116577681 | A | | 8/2023 | |
| CN | 114714987 | B | | 6/2024 | |
| JP | 6631297 | B2 | | 1/2020 | |
| TW | I842258 | B | | 5/2024 | |
| TW | I860921 | B | | 11/2024 | |
| WO | WO 2023/241780 | A1 | | 12/2023 | |

OTHER PUBLICATIONS

Ahmadi et al., "Lifecycle assessment of diesel, diesel-electric and hydrogen fuel cell transit buses with fuel cell degradation and battery aging using machine learning techniques", Energy 259 (2022) 125003, pp. 1-12.

Ettihir et al., "Design of an adaptive EMS for fuel cell vehicles", International Journal of Hydrogen Energy 42 (2017), pp. 1481-1489.

Fu et al., "A novel online energy management strategy for fuel cell vehicles based on improved random forest regression in multi road modes", Energy Conversion and Management 305 (2024) 118261, pp. 1-13.

Lin et al., "Investigation of dynamic driving cycle effect on performance degradation and micro-structure change of PEM fuel cell", International Journal of Hydrogen Energy 34 (2009), pp. 2369-2376.

Lu et al., "A semi-empirical voltage degradation model for a low-pressure proton exchange membrane fuel cell stack under bus city driving cycles", Journal of Power Sources 164 (2007), pp. 306-314.

Mousavi et al., "Performance evaluation of a hybrid hydrogen fuel cell/battery bus with fuel cell degradation and battery aging", Renewable Energy 227 (2024) 120456, pp. 1-15.

Pahon et al., "Performance analysis of proton exchange membrane fuel cell in automotive applications", Journal of Power Sources 510 (2021) 230385, pp. 1-7.

Tao et al., "Optimization of energy management strategy for fuel cell/battery/ultracapacitor hybrid electric vehicle using distributed interior point", Electric Power Systems Research 230 (2024) 110287, pp. 1-12.

Wang et al., "Adaptive Equivalent Consumption Minimization Strategy for Fuel Cell Ships Suffering From Efficiency Degradation", 2024 36th Chinese Control and Decision Conference (CCDC), pp. 3129-3134.

Wang et al., "Energy management strategy with mutation protection for fuel cell electric vehicles", International Journal of Hydrogen Energy 63 (2024), pp. 48-58.

Wu et al., "Enhancing fuel cell electric vehicle efficiency with TIP-EMS: A trainable integrated predictive energy management approach", Energy Conversion and Management 310 (2024) 118499, pp. 1-14.

Yue et al., "Towards the Energy Management of a Fuel cell/Battery Vehicle Considering Degradation", IEEE Xplore, 2025, total 6 pages.

Zhang et al., "Fuel cell parameter analysis and constraint optimization based on Nelder-Mead simplex algorithm considering performance degradation", International Journal of Hydrogen Energy 69 (2024) pp. 1548-1564.

* cited by examiner

ELECTRIC ENERGY MANAGING SYSTEM AND METHOD THEREOF

This application claims the benefit of Taiwan application Serial No. 113149440, filed Dec. 18, 2024, the disclosure of which is incorporated by reference herein in its entirety.

TECHNICAL FIELD

The present disclosure relates to an electric energy managing mechanism, and particularly relates to an electric energy managing system and an electric energy managing method for managing energy distribution of an electric vehicle.

BACKGROUND

Electric vehicle is usually equipped with dual power supplies, including a fuel cell and a lithium battery. However, some existing electric vehicle lacks a complete electric managing mechanism. For example, if a state-of-health (SOH) of a fuel cell is not clearly defined, and electric energy managing cannot be performed according to the SOH of the fuel cell. Therefore, electric energy distribution for electric vehicle with hybrid-energy may not be well performed according to the SOH of the fuel cell. Alternatively, even though the degradation of fuel cells is considered, but may only considering how to reduce the degradation of fuel cells, and no control is performed from the perspective of overall electric energy managing.

In addition, some existing electric vehicle does not take into account the aging of fuel cell and secondary power system (i.e., the lithium battery). However, when the fuel cell and the secondary power system have aged, the electric energy distribution for some existing electric vehicle cannot be optimally scheduled, resulting in the following result: the longer the electric vehicle is used, the worse its energy consumption becomes. In addition, the lifetime of the fuel cell and the secondary power system of this case is greatly reduced, accordingly.

In order to address the above issues, an improved electric energy managing mechanism may be needed, which could clearly define the SOH of the fuel cell, and consider both the SOHs of the fuel cell and the lithium battery for performing electric energy distribution for the electric vehicle, thereby achieving optimal scheduling.

SUMMARY

According to one embodiment of the present disclosure, an electric energy managing system is provided. The electric energy managing system is applied to an electric vehicle, and comprises the following elements. A first state-of-health (SOH) calculating circuit, is for calculating an overall SOH of a fuel cell of the electric vehicle, wherein the overall SOH is associated with an aging condition of the fuel cell. A second SOH calculating circuit, is for calculating a SOH of a lithium battery of the electric vehicle, wherein the SOH is associated with an aging condition of the lithium battery. An electric energy distribution circuit, is for calculating a first predefined ratio of an output power of the fuel cell with respect to a total electric energy demand of the electric vehicle according to the overall SOH of the fuel cell and the SOH of the lithium battery, and controlling a second predefined ratio of the output power of the fuel cell with respect to an output power of the lithium battery according to the first predefined ratio.

According to another embodiment of the present disclosure, an electric energy managing method is provided. The electric energy managing method is applied to an electric vehicle, and comprises the following steps. An overall SOH of a fuel cell of the electric vehicle is calculated, the overall SOH is associated with an aging condition of the fuel cell. A SOH of a lithium battery of the electric vehicle is calculated, the SOH is associated with an aging condition of the lithium battery. A first predefined ratio of an output power of the fuel cell with respect to a total electric energy demand of the electric vehicle is calculated according to the overall SOH of the fuel cell and the SOH of the lithium battery. A second predefined ratio of the output power of the fuel cell with respect to an output power of the lithium battery is controlled according to the first predefined ratio.

BRIEF DESCRIPTION OF THE DRAWINGS

FIG. 4B-1 illustrate a surface plot of the penalty weight $f_{b(dis)}(SOH_b, SOC_b)$ when the lithium battery 200 is discharged.

FIG. 4B-2 illustrates a surface plot of the penalty weight $f_{b(chg)}(SOH_b, SOC_b)$ when the lithium battery 200 is charged.

Figure 1:
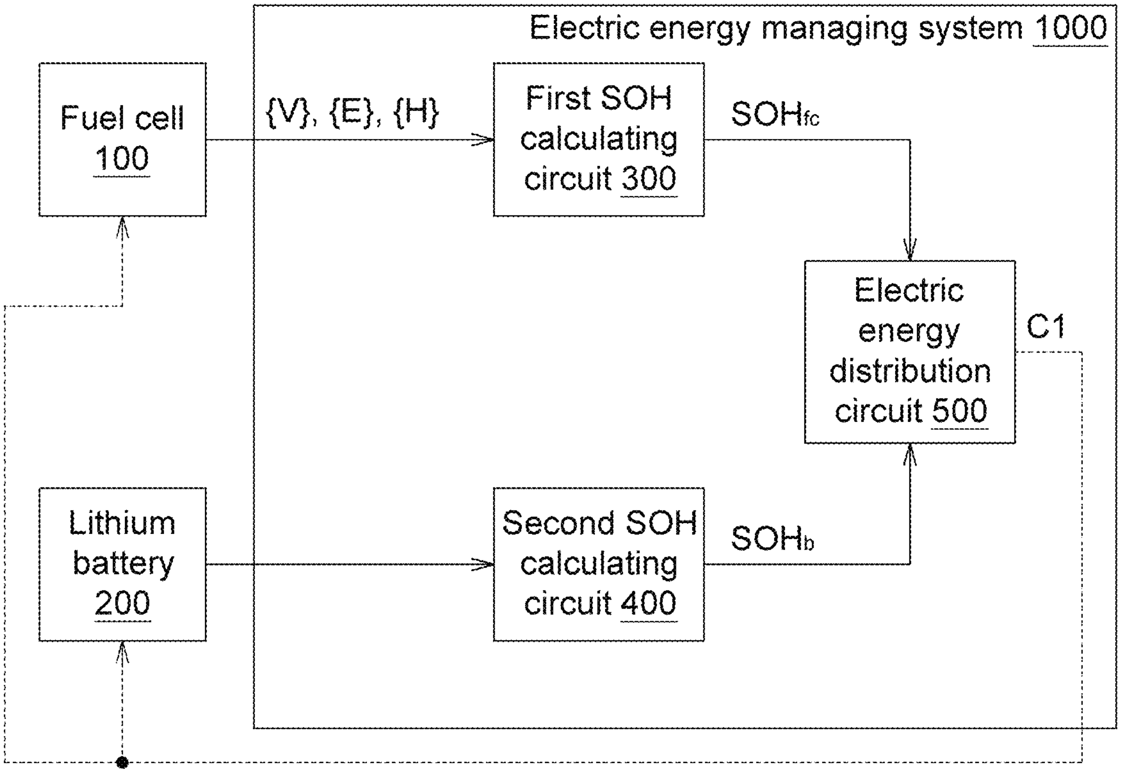
FIG. 1 is a block diagram of an electric energy managing system 1000 according to an embodiment of the present disclosure.

In the following detailed description, for purposes of describing, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 is a block diagram of an electric energy managing system 1000 according to an embodiment of the present disclosure. The electric energy managing system 1000 includes a first state-of-health (SOH) calculating circuit 300, a second SOH calculating circuit 400 and an electric energy distribution circuit 500. The electric energy managing system 1000 is used to manage the output of the electric energy of the fuel cell 100 and the lithium battery 200 of the electric vehicle. In one example, the lithium battery 100 is a high-voltage lithium battery disposed in an electric vehicle, and the fuel cell 100 is a proton-exchange membrane fuel cell (PEMFC) disposed in an electric vehicle.

The electric energy managing system 1000 is a component in the form of a hardware circuit, such as a chip of integrated circuit, a system circuit formed on a printed circuit, or various forms of processors which include but not limited to a digital signal processor (DSP), a central processing unit (CPU), and a micro control unit (MCU), etc. The first SOH calculating circuit 300, the second SOH calculating circuit 400 and the electric energy distribution circuit 500 are all hardware circuitry units inside the electric energy managing system 1000.

The first SOH calculating circuit 300 is used to calculate an overall state-of-health $SOH_{fc}$ of the fuel cell 100, and the second SOH calculating circuit 400 is used to calculate a state-of-health $SOH_b$ of the lithium battery 200. The electric energy distribution circuit 500 schedules the electric energy distribution strategy of the fuel cell 100 and the lithium battery 200 according to the overall state-of-health $SOH_{fc}$ of the fuel cell 100 and the state-of-health SOHb of the lithium battery 200, and generates a control signal C1. The electric energy distribution circuit 500 provides the control signal C1 to the fuel cell 100 and the lithium battery 200, and controls the output of electric energy of the fuel cell 100 and the lithium battery 200 according to the control signal C1.

The first SOH calculating circuit 300 measures or estimates several parameters of the fuel cell 100, including a voltage parameter set {V}, a power amount parameter set {E}, and a hydrogen consumption parameter set {H}. The first SOH calculating circuit 300 calculates the overall state-of-health $SOH_{fc}$ of the fuel cell 100 according to the above parameter sets {V}, {E} and {H}.

Figure 2A:
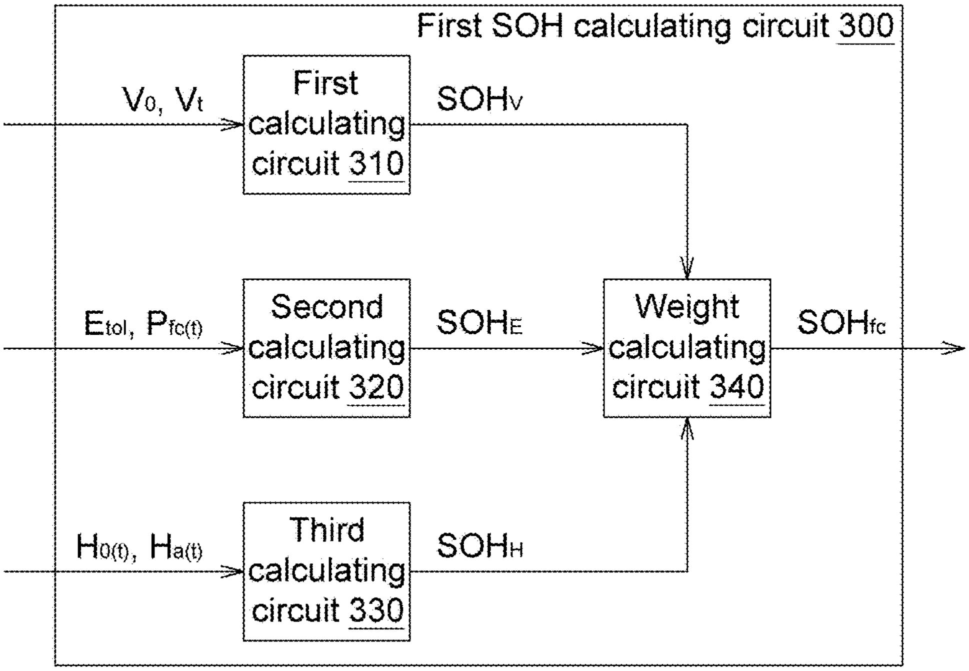
FIG. 2A is a block diagram of the first SOH calculating circuit 300.

FIG. 2A is a block diagram of the first SOH calculating circuit 300. As shown in FIG. 2A, the first SOH calculating circuit 300 defines the overall state-of-health $SOH_{fc}$ of the fuel cell 100. The overall state-of-health $SOH_{fc}$ includes three components: a voltage decay state-of-health $SOH_V$, a total power amount state-of-health $SOH_E$ and a hydrogen consumption change state-of-health $SOH_H$. The first SOH calculating circuit 300 includes a first calculating circuit 310, a second calculating circuit 320, a third calculating circuit 330 and a weight calculating circuit 340. The first calculating circuit 310, the second calculating circuit 320, the third calculating circuit 330 and the weight calculating circuit 340 are all hardware circuitry components, such as integrated circuit chips, system circuits formed on printed circuit boards, or microcontrollers. Functionally, the first calculating circuit 310 is used to calculate the voltage decay state-of-health $SOH_V$ of the fuel cell 100, the second calculating circuit 320 is used to calculate the total power amount state-of-health $SOH_E$ of the fuel cell 100, and the third calculating circuit 330 is used to calculate the hydrogen consumption change state-of-health $SOH_H$ of the fuel cell 100. Furthermore, the weight calculating circuit 340 is used to perform a weight operation on the voltage decay state-of-health $SOH_V$, the total power amount state-of-health $SOH_E$ and the hydrogen consumption change state-of-health $SOH_H$, so as to obtain the overall state-of-health $SOH_{fc}$ of the fuel cell 100.

First, the basic operation of the first calculating circuit 310 is described (the detailed operation of the first calculating circuit 310 will be further described in later paragraphs). The first calculating circuit 310 estimates an ideal voltage V0 of the fuel cell 100 and measures an actual voltage Vt of the fuel cell 100 at time point t. The ideal voltage V0 is a normal voltage of the fuel cell 100 before aging occurs, and the actual voltage Vt is a voltage of the fuel cell 100 after being used for a period of time and aging occurs. The ideal voltage V0 and the actual voltage Vt of the fuel cell 100 are included in the voltage parameter set {V} of FIG. 1.

The first calculating circuit 310 may include a measuring circuit in the form of a hardware circuit, which is used to measure the ideal voltage $V_0$ and the actual voltage Vt of the fuel cell 100. Alternatively, the first calculating circuit 310 may include an internal lookup table, or the first calculating circuit 310 may operate in conjunction with an external lookup table, so as to analyze the current-voltage characteristic curve of the state-of-health change of the fuel cell 100, and perform a two-dimensional table lookup for the table, so as to obtain the real-time ideal voltage $V_0$ and actual voltage $V_t$ of the fuel cell 100.

The voltage decay state-of-health $SOH_V$ of the fuel cell 100 is defined as equation (1-1). According to equation (1-1), the first calculating circuit 100 calculates a ratio of the actual voltage $V_t$ with respect to the ideal voltage $V_0$ of the fuel cell 100, and obtains the voltage decay state-of-health $SOH_V$ accordingly. The first calculating circuit 310 may include a divider in the form of a hardware circuit, which is used to calculate the ratio of the actual voltage $V_t$ with respect to the ideal voltage $V_0$, and further calculate the voltage decay state-of-health $SOH_V$.

$$SOH_V = 1 - \frac{V_0 - V_t}{V_0} = \frac{V_t}{V_0} \tag{1-1}$$

Next, the operation of the second calculating circuit 320 is described. The second calculating circuit 320 estimates a predefined total power amount $E_{tol}$ of the fuel cell 100. The predefined total power amount $E_{tol}$ is a predefined value of the fuel cell 100 when it leaves the manufacturing factory. The second calculating circuit 320 may include an internal database, or the second calculating circuit 320 may cooperate with an external database. This database records the specification sheets provided by the supplier(s) of the fuel cell 100. The second calculating circuit 320 searches the specification sheets recorded in the database, so as to obtain the total lifetime of the fuel cell 100 and the rated maximum output power. Furthermore, the second calculating circuit 320 includes a multiplier in the form of a hardware circuit, which is used to calculate a product of the total lifetime of the fuel cell 100 and the rated maximum output power. Such a product is the predefined total power amount $E_{tol}$ of the fuel cell 100.

The second calculating circuit 320 further includes a measuring circuit in the form of a hardware circuitry, so as to measure the actual output power $P_{fc(t)}$ of the fuel cell 100 at the time point t. Furthermore, the second calculating circuit 320 includes an integrator in the form of a hardware circuitry, which is used to calculate the cumulative power amount E(t1) of the fuel cell 100 from the starting time point 0 to the current time point t1, as shown in equation (1-2). The cumulative power amount E(t1) of the fuel cell 100 represents the power amount consumed by the fuel cell 100 during the period from the starting time point 0 to the current time point t1. The above-mentioned predefined total power amount $E_{tol}$ and cumulative power amount E(t1) are included in the power amount parameter set {E} of FIG. 1.

$$E(t1) = \frac{\int_0^{t1} P_{fc(t)}dt}{3600000} \tag{1-2}$$

Then, the second calculating circuit 320 calculates a difference value between the predefined total power amount $E_{tol}$ of the fuel cell 100 and the cumulative power amount E(t1) according to a subtractor in the form of a hardware circuitry. Furthermore, the second calculating circuit 320 calculates a ratio of the above-mentioned difference value with respect to the predefined total power amount $E_{tol}$, according to a divider in the form of a hardware circuitry. Accordingly, the second calculating circuit 320 calculates the total power amount state-of-health $SOH_E$ of the fuel cell 100 at the current time point t1, as shown in equation (1-3):

$$SOH_E = \frac{E_{tol} - E(t1)}{E_{tol}} \tag{1-3}$$

Next, the operation of the third calculating circuit 330 is described. The third calculating circuit 330 estimates the ideal hydrogen consumption $H_{0(t)}$ of the fuel cell 100, and measures the actual hydrogen consumption $H_{a(t)}$ of the fuel cell 100 at the time point t. The ideal hydrogen consumption $H_{0(t)}$ is the normal hydrogen consumption of the fuel cell 100 before aging, and the actual hydrogen consumption $H_{a(t)}$ is the hydrogen consumption of the fuel cell 100 after it has been used for a period of time and has aged. The above-mentioned ideal hydrogen consumption $H_{0(t)}$ and the actual hydrogen consumption $H_{a(t)}$ are included in the hydrogen consumption parameter set {H} in FIG. 1.

The third calculating circuit 330 may include an internal database and a lookup table, or the third calculating circuit 330 may cooperate with an external database and lookup table. The above-mentioned database records data about an increase in hydrogen consumption of the fuel cell 100 after aging. The third calculating circuit 330 analyzes the curve of the change in the state-of-health of the fuel cell 100 corresponding to the change in hydrogen consumption, according to the data of the increase in hydrogen consumption. Then, the third calculating circuit 330 performs a two-dimensional table lookup on the lookup table, so as to obtain the instantaneous (i.e., real time) ideal hydrogen consumption $H_{0(t)}$ and the actual hydrogen consumption $H_{a(t)}$ of the fuel cell 100. In one example, after the electric vehicle is charged with hydrogen for last time, the third calculating circuit 330 calculates the total hydrogen consumption which is accumulated to the current time point t1, and when the electric vehicle is charged with hydrogen for the next time, the third calculating circuit 330 obtains information about the hydrogen charging amount of the electric vehicle, and calculates the increase in hydrogen consumption of the fuel cell 100 between the two times of hydrogen charging, so as to obtain the real-time actual hydrogen consumption $H_{a(t)}$.

The third calculating circuit 300 calculates the total hydrogen consumption of the ideal hydrogen consumption $H_{0(t)}$ and the actual hydrogen consumption $H_{a(t)}$ which are accumulated to the current time point t1, by means of an integrator in the form of a hardware circuitry. Furthermore, the third calculating circuit 300 calculates a difference value and a ratio value of the total hydrogen consumption by means of a subtractor, and calculates the hydrogen consumption change state-of-health $SOH_H$ of the fuel cell 100 accordingly, as shown in equation (1-4):

$$SOH_H = 1 - \frac{\int_0^{t1} H_{a(t)}dt - \int_0^{t1} H_{0(t)}dt}{\int_0^{t1} H_{0(t)}dt} \tag{1-4}$$

The first calculating circuit 310 calculates and updates the voltage decay state-of-health $SOH_V$ in an offline manner. Similarly, the third calculating circuit 330 also calculates and updates the hydrogen consumption change state-of-health $SOH_H$ in an offline manner. In contrast, the second calculating circuit 320 calculates and updates the total power amount state-of-health $SOH_E$ in a real-time manner. Then, the weight calculating circuit 340 receives the voltage decay state-of-health $SOH_V$ from the first calculating circuit 310, receives the total power amount state-of-health $SOH_E$ from the second calculating circuit 320, and receives the hydrogen consumption change state-of-health $SOH_H$ from the third calculating circuit 330. The weight calculating circuit 340 performs a weight operation on the voltage decay state-of-health $SOH_V$, the total power amount state-of-health $SOH_E$ and the hydrogen consumption change state-of-health $SOH_H$, so as to obtain the overall state-of-health $SOH_{fc}$ of the fuel cell 100.

Figure 2B:
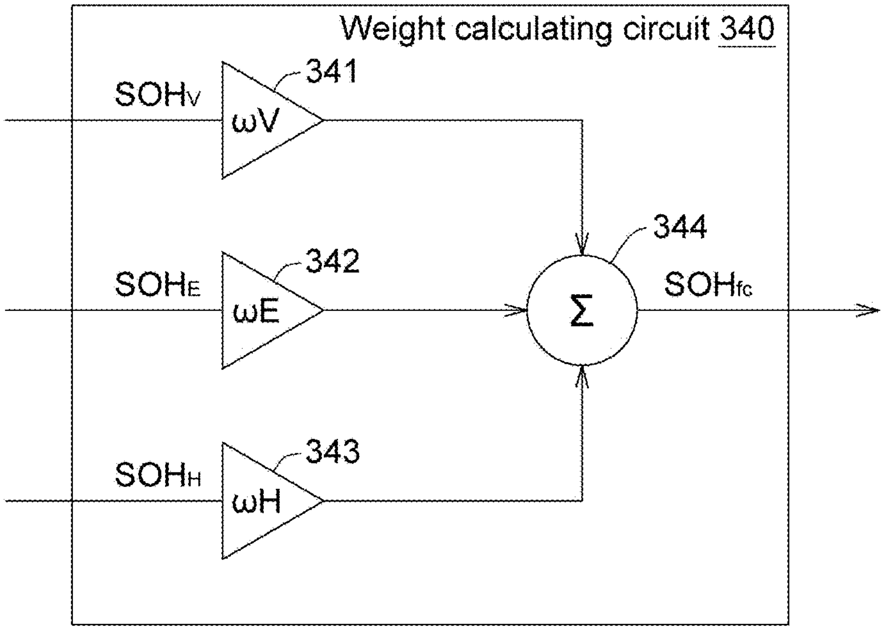
FIG. 2B is a block diagram of the weight calculating circuit 340.

FIG. 2B is a block diagram of the weight calculating circuit 340. As shown in FIG. 2B, the weight calculating circuit 340 includes weight multiplication circuits 341-343 and a summing circuit 344. The weight multiplication circuit 341 is used for performing a product operation on the voltage decay state-of-health $SOH_V$ and the voltage decay state-of-health weight ωV. The weight multiplication circuit 342 is used for performing a product operation on the total power amount state-of-health $SOH_E$ and the total power amount state-of-health weight ωE. The weight multiplication circuit 343 is used for performing a product operation of the hydrogen consumption change state-of-health $SOH_E$ and the hydrogen consumption change state-of-health weight ωH. Furthermore, the summing circuit 344 sums up the product operation results of the weight multiplication circuits 341-343, so as to obtain the overall state-of-health $SOH_{fc}$ of the fuel cell 100, as shown in equation (2):

$$SOH_{fc} = \omega V \times SOH_V + \omega E \times SOH_E + \omega H \times SOH_H \tag{2}$$

More specifically, the weight calculating circuit 340 may evaluate the reliability level (i.e., confidence) of each of the first calculating circuit 310, the second calculating circuit 320, and the third calculating circuit 330. Furthermore, the weight calculating circuit 340 sets the values of the voltage decay state-of-health weight ωV, the total power amount state-of-health weight ωE, and the hydrogen consumption change state-of-health weight ωH according to these reliability levels.

The above reliability levels indicate the accuracy of the calculating results of the first calculating circuit 310, the second calculating circuit 320 and the third calculating circuit 330. For example, the first calculating circuit 310 directly measures the relevant voltage of the fuel cell 100 and performs calculations to obtain the voltage decay state-of-health $SOH_V$. Such a calculation result has a higher accuracy, and thus the reliability level of the first calculating circuit 310 is higher. Therefore, the weight calculating circuit 340 sets the voltage decay state-of-health weight ωV to a higher value, e.g., 50%.

In contrast, the second calculating circuit 320 and the third calculating circuit 330 calculate the total power amount state-of-health $SOH_E$ and the hydrogen consumption change state-of-health $SOH_H$ by referring to the supplier's specification sheet which is recorded in the database. The specification sheet provided by the supplier may have subjective components and thus may be less reliable. Therefore, the weight calculating circuit 340 sets the total power amount state-of-health weight ωE and the hydrogen consumption change state-of-health weight ωH to relatively low values, such as 25%.

Figure 3A:
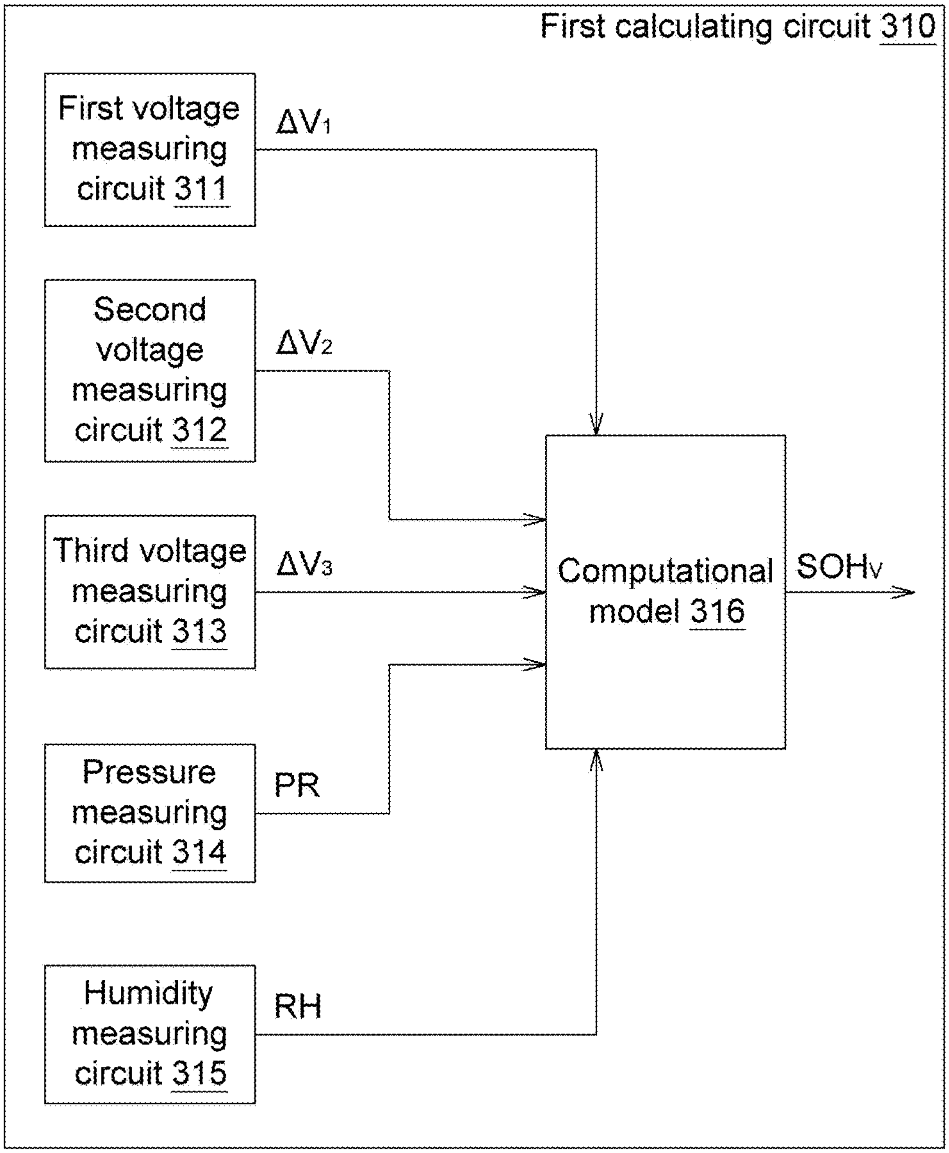
FIG. 3A is a block diagram of the first calculating circuit 310.

Next, please refer to FIG. 3A, which is a block diagram of the first calculating circuit 310, to further describe the detailed operation of the first calculating circuit 310. The first calculating circuit 310 includes a first voltage measuring circuit 311, a second voltage measuring circuit 312, a third voltage measuring circuit 313, a pressure measuring circuit 314, a humidity measuring circuit 315 and a computational model 316.

After the electric vehicle is keyed on, the first voltage measuring circuit 311 measures the decay voltage $\Delta V_1$ of the fuel cell 100 in a high current condition. Furthermore, the second voltage measuring circuit 312 measures the decay voltage $\Delta V_2$ of the fuel cell 100 in a medium current condition. Moreover, the third voltage measuring circuit 313 measures the decay voltage $\Delta V_3$ of the fuel cell 100 in a low current condition. The above-mentioned decay voltages $\Delta V_1$, $\Delta V_2$ and $\Delta V_3$ are included in the voltage parameter set {V} of FIG. 1, and the decay voltages $\Delta V_1$, $\Delta V_2$ and $\Delta V_3$ correspond to the actual voltage $V_r$.

Furthermore, the pressure measuring circuit 314 measures the hydrogen pressure PR of the fuel cell 100, and the humidity measuring circuit 315 measures the relative humidity RH of the fuel cell 100.

The computational model 316 is, for example, a neural network model. The inputs of the computation model 316 are the decay voltage ΔV1, the decay voltage ΔV2, the decay voltage ΔV3, the hydrogen pressure PR and the relative humidity RH which are measured at the current time point t. The computational model 316 performs an inference operation to obtain the voltage decay state-of-health $SOH_V$. Since the decay voltage ΔV1, decay voltage ΔV2 and decay voltage $\Delta V_3$ inputted by the computational model 316 are respectively measured in three conditions of the fuel cell 100 (i.e., the high current condition, the medium current condition and the low current condition), the voltage decay state-of-health $SOH_V$ obtained by the computational model 316 is the average value of the three conditions, i.e., an average voltage decay state-of-health $SOH_V$ of the fuel cell 100 among the high current condition, the medium current condition and the low current condition.

Figure 3B:
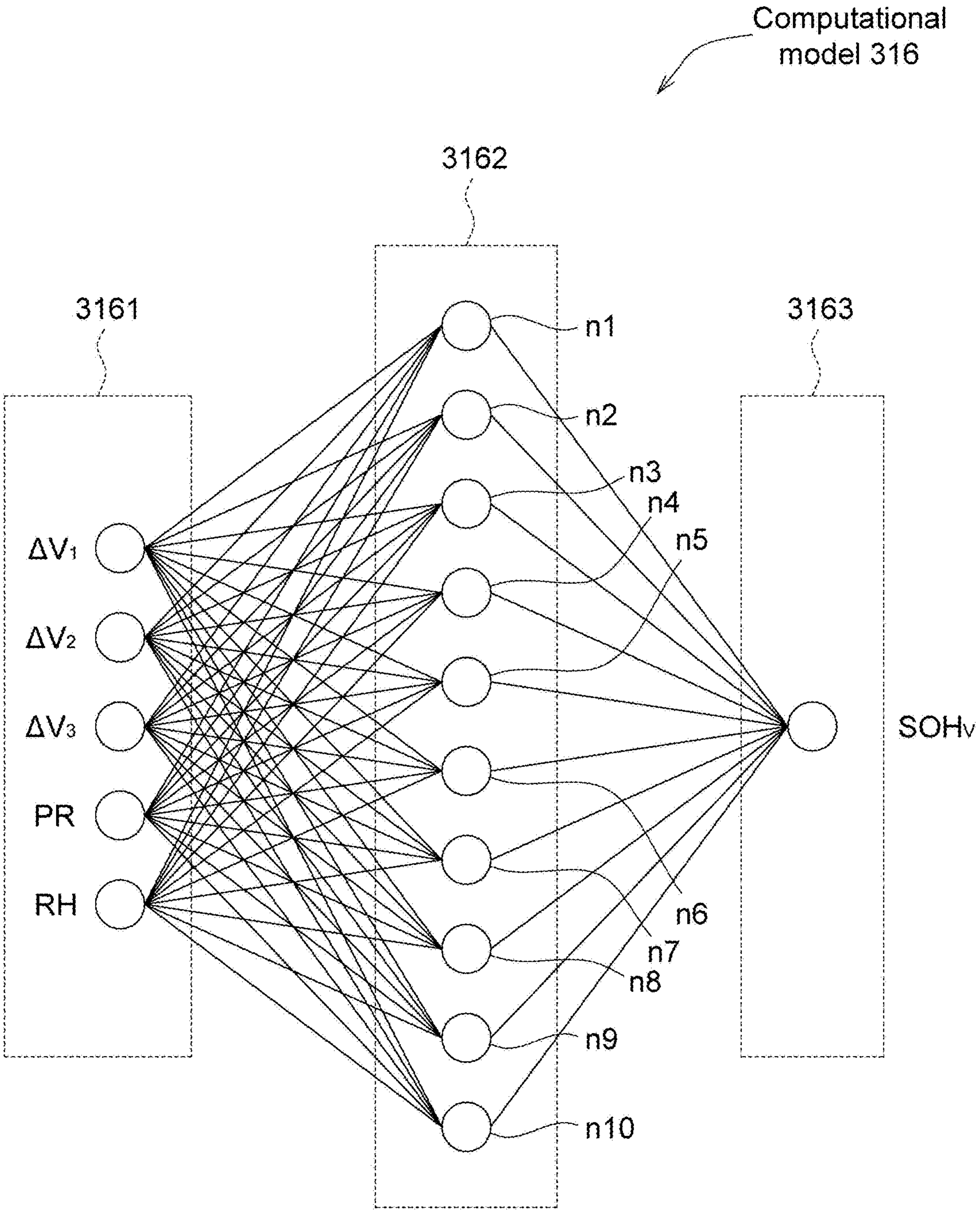
FIG. 3B is a schematic diagram of the computational model 316.

Next, please refer to FIG. 3B, which is a schematic diagram of the computational model 316. The computational model 316 has architecture of a back-propagation neural network, and includes an input layer 3161, an intermediate layer 3162, and an output layer 3163.

The input layer 3161 receives the decay voltage ΔV1, the decay voltage ΔV2, the decay voltage ΔV3, the hydrogen pressure PR and the relative humidity RH. The intermediate layer 3162 is a hidden layer, for example, it includes 10 neurons n1-n10. The intermediate layer 3162 performs the inference operation according to the decay voltage ΔV1, the decay voltage ΔV2, the decay voltage ΔV3, the hydrogen pressure PR and the relative humidity RH, so as to calculate the voltage decay state-of-health $SOH_V$ of the fuel cell 100. Then, the output layer 3163 outputs the voltage decay state-of-health $SOH_V$.

Next, please refer to FIG. 1 again. The first SOH calculating circuit 300 calculates the overall state-of-health $SOH_{fc}$ of the fuel cell 100, and the second SOH calculating circuit 400 obtains the state-of-health $SOH_b$ of the lithium battery 200. The electric energy distribution circuit 500 calculates a predefined ratio α of the output power $P_{fc}$ of the fuel cell 100 with respect to the total electric energy demand Pd of the electric vehicle, according to the overall state-of-health $SOH_{fc}$ of the fuel cell 100, the state-of-health $SOH_b$ of the lithium battery 200 and other parameters. Furthermore, the electric energy distribution circuit 500 performs electric energy distribution between the fuel cell 100 and the lithium battery 200, according to the predefined ratio α.

Figure 4A:
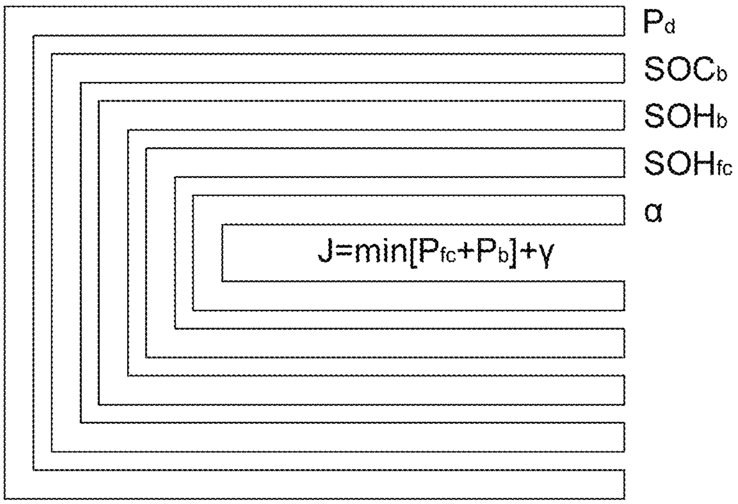
FIG. 4A is a schematic diagram of the electric energy distribution circuit 500 performing the electric energy distribution by utilizing a specific algorithm.

Next, please refer to FIG. 4A, which is a schematic diagram of the electric energy distribution circuit 500 performing the electric energy distribution by utilizing a specific algorithm. For example, the electric energy distribution circuit 500 performs the electric energy distribution between the fuel cell 100 and the lithium battery 200 by utilizing a honey-comb loop architecture with a global search algorithm (GSA). In the global search algorithm, the electric energy distribution circuit 500 defines the objective function J as shown in equation (3-1). The value of the objective function J is associated with the minimum value of the sum of the output power $P_{fc}$ of the fuel cell 100 and the output power Pb of the lithium battery 200.

$$J = \min[Pfc + Pb] + \gamma \tag{3-1}$$

The driving power as a whole of the electric vehicle, is provided by the fuel cell 100 in conjunction with the lithium battery 200. The total electric energy demand Pd of the electric vehicle is equal to the sum of the output power $P_{fc}$ of the fuel cell 100 and the output power $P_b$ of the lithium battery 200, as shown in equation (3-2). In other words, the value of the objective function J is related to the total electric energy demand Pd of the electric vehicle.

$$Pd = P_{fc} + P_b \tag{3-2}$$

More specifically, the output power $P_{fc}$ of the fuel cell 100 is proportional to a product of the output power $P_{fc(dis)}$ of the fuel cell 100 during discharging and the penalty weight $f_{fc}(SOH_{fc})$ of the fuel cell 100 during discharging, as shown in equation (3-3). The output power $P_{fc(dis)}$ of the fuel cell 100 during discharging may be referred to as "discharging output power", and the penalty weight $f_{fc}(SOH_{fc})$ during discharging may be referred to as "discharging penalty weight".

$$P_{fc} = P_{fc(dis)} \times \frac{1}{\eta_{fc}} \times f_{fc}(SOH_{fc}) \tag{3-3}$$

On the other hand, the output power $P_b$ of the lithium battery 200 is a sum of two components, as shown in equation (3-4):

$$P_b = P_{b\_1} + P_{b\_2} \tag{3-4}$$

The first component $P_{b\_1}$ is associated with the charging of the lithium battery 200, and the second component $P_{b\_2}$ is associated with the discharging of the lithium battery 200. More specifically, the first component $P_{b\_1}$ is proportional to a product of the output power $P_b$ (chg) of the lithium battery 200 when it is charged and the penalty weight $f_{b(chg)}(SOH_b, SOC_b)$ of the lithium battery 200 when it is charged, as shown in equation (3-5). The output power $P_{b(chg)}$ of the lithium battery 200 during charging may be referred to as "charging output power", and the penalty weight $f_{b(chg)}(SOH_b, SOC_b)$ during charging may be referred to as "charging penalty weight".

$$P_{b\_1} = P_{b(chg)} \times \eta_b \times x \times f_{b(chg)}(SOH_b, SOC_b) \tag{3-5}$$

The second component $P_{b\_2}$ is proportional to a product of the output power $P_{b(dis)}$ of the lithium battery 200 during discharging and the penalty weight $f_{b(dis)}(SOH_b, SOC_b)$ of the lithium battery 200 during discharging, as shown in equation (3-6). The output power $P_{b(dis)}$ of the lithium battery 200 during discharging may be referred to as "discharging output power", and the penalty weight $f_{b(dis)}(SOH_b, SOC_b)$ during discharging may be referred to as "discharging penalty weight".

$$P_{b\_2} = P_{b(dis)} \times \frac{1}{\eta_b} \times (1 - x) \times f_{b(dis)}(SOH_b, SOC_b) \tag{3-6}$$

The electric energy distribution circuit 500 performs the global search algorithm according to the objective function J, so as to obtain the best predefined ratio α. The predefined ratio α is the ratio of the output power $P_{fc}$ of the fuel cell 100 with respect to the total electric energy demand Pd of the electric vehicle, as shown in equation (3-7):

$$\alpha = \frac{P_{fc}}{P_d} \tag{3-7}$$

Furthermore, the electric energy distribution circuit 500 distributes the electric energy between the fuel cell 100 and the lithium battery 200 according to the predefined ratio α, so that the ratio of the output power $P_{fc}$ of the fuel cell 100 with respect to the output power $P_b$ of the lithium battery 200 satisfies the predefined ratio β, as shown in equation (3-8):

$$\frac{P_{fc}}{P_b} = \beta = \frac{\propto}{1 - \propto} \tag{3-8}$$

When calculating the objective function J, the electric energy distribution circuit 500 takes into account the penalty weight $f_{fc}(SOH_{fc})$ when the fuel cell 100 is discharged, the penalty weight $f_{b(chg)}(SOH_b, SOC_b)$ when the lithium battery 200 is charged, and the penalty weight $f_{b(dis)}(SOH_b, SOC_b)$ when the lithium battery 200 is discharged, so as to reduce the use of the lithium battery 200 or the fuel cell 100, and thereby reduce additional energy consumption caused by the aging of the lithium battery 200 or the fuel cell 100.

Figures 1, 4B:
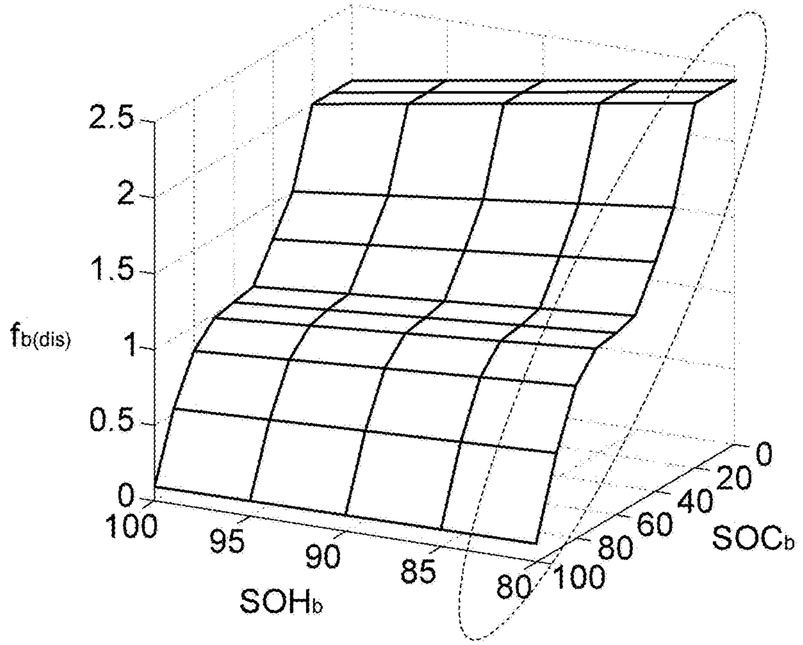

Please refer to FIG. 4B-1, which illustrate a surface plot of the penalty weight $f_{b(dis)}(SOH_b, SOC_b)$ when the lithium battery 200 is discharged. When the lithium battery 200 is discharged, the lower the state-of-health $SOH_b$ and the state-of-charge $SOC_b$ of the lithium battery 200 are, the larger the value of the penalty weight $f_{b(dis)}(SOH_b, SOC_b)$ is.

Figures 2, 4B:
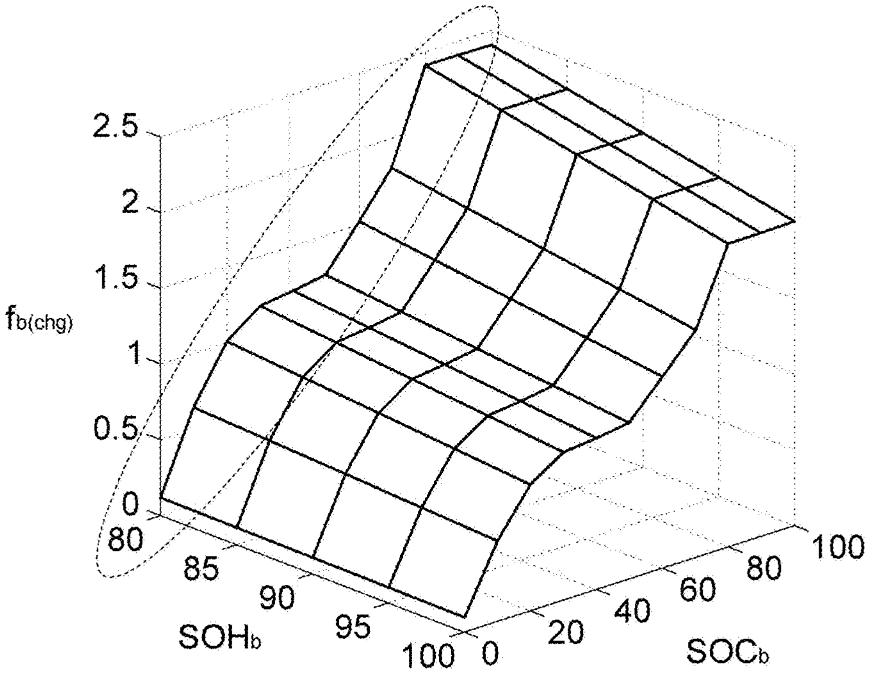

On the other hand, please refer to FIG. 4B-2, which illustrates a surface plot of the penalty weight $f_{b(chg)}(SOH_b, SOC_b)$ when the lithium battery 200 is charged. When the lithium battery 200 is being charged, the higher the state-of-health $SOH_b$ and the state-of-charge $SOC_b$ of the lithium battery 200 are, the larger the value of the penalty weight $f_{b(chg)}(SOH_b, SOC_b)$ is.

Figure 4C:
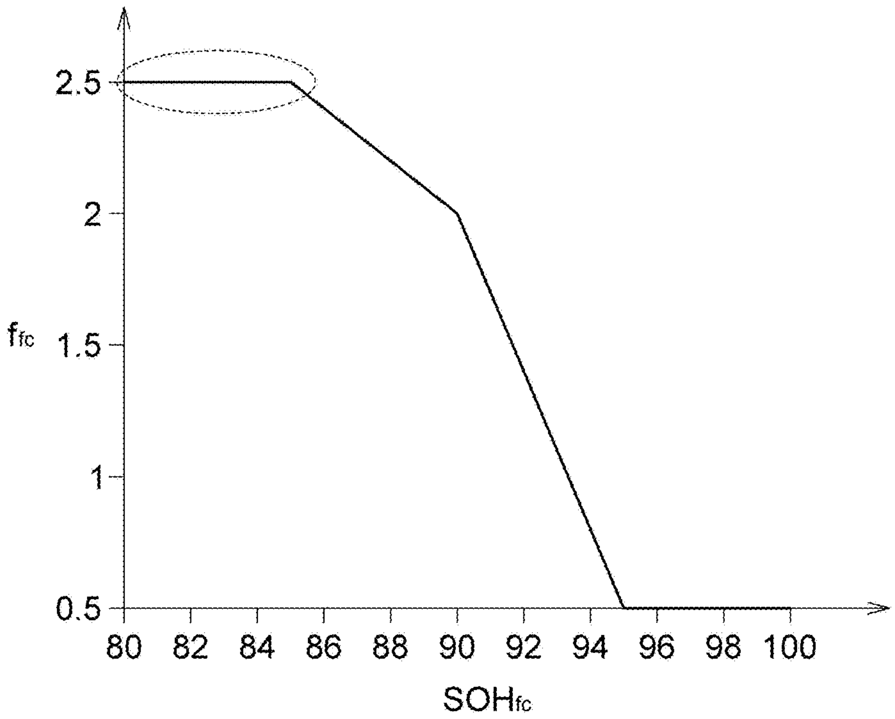
FIG. 4C illustrates a line graph of the penalty weight $f_{fc}(SOH_{fc})$ when the fuel cell 100 is discharged.

Please refer to FIG. 4C, which illustrates a line graph of the penalty weight $f_{fc}(SOH_{fc})$ when the fuel cell 100 is discharged. When the fuel cell 100 is being discharged, the lower the state-of-health $SOH_{fc}$ of the fuel cell 100 is, the larger the value of the penalty weight $f_{fc}(SOH_{fc})$ is.

Figure 5A:
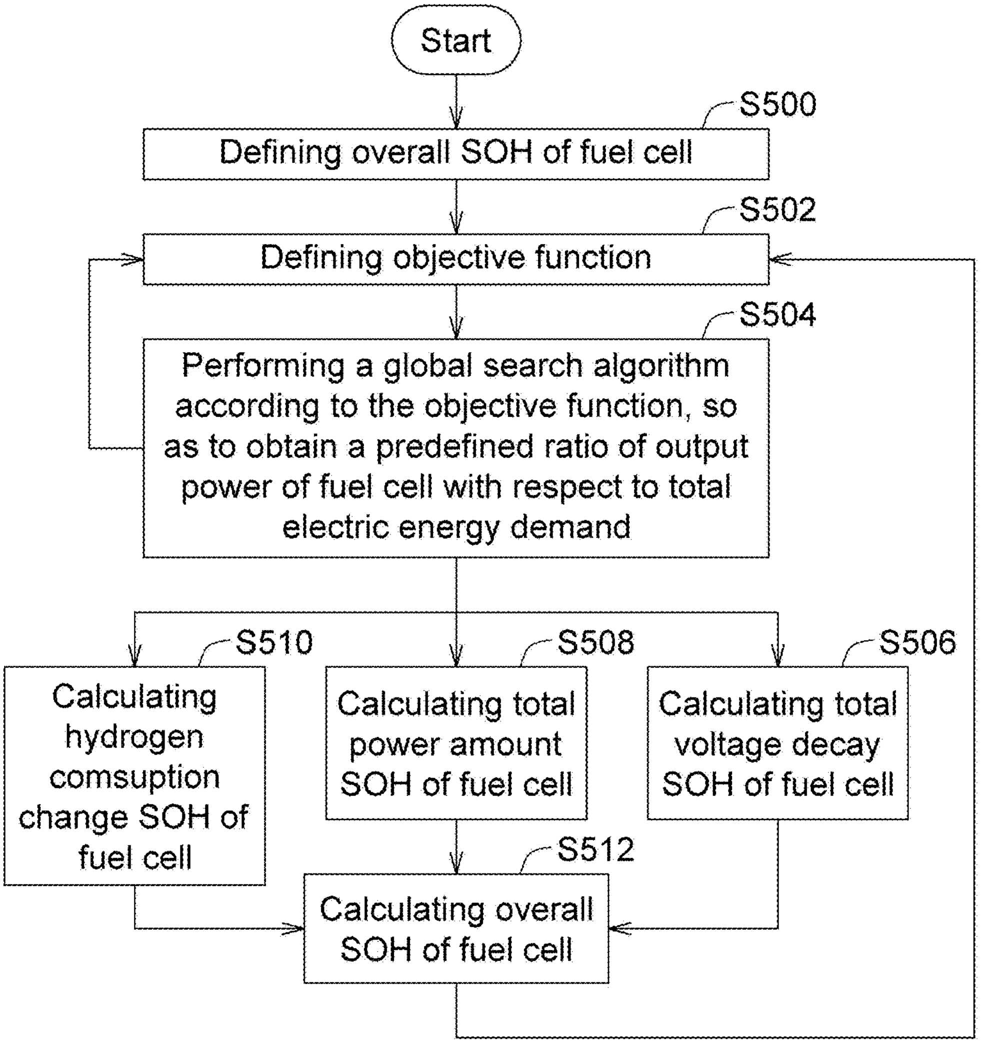
FIG. 5A is a flow diagram of an electric energy managing method according to an embodiment of the present disclosure.

FIG. 5A is a flow diagram of an electric energy managing method according to an embodiment of the present disclosure. The electric energy managing method of this embodiment can be implemented by the electric energy managing system 1000 in FIG. 1. As shown in FIG. 5A, firstly, step S500 is performed: the first SOH calculating circuit 300 of the electric energy managing system 1000 defines the overall state-of-health $SOH_{fc}$ of the fuel cell 100. Next, step S502 is executed: the electric energy distribution circuit 500 of the electric energy managing system 1000 defines the objective function J. The value of the objective function J is associated with the minimum value of the sum of the output power $P_{fc}$ of the fuel cell 100 and the output power $P_b$ of the lithium battery 200.

Next, execute step S504: the electric energy managing system 1000 performs a global search algorithm according to the objective function J, so as to obtain an optimal predefined ratio α of the output power $P_{fc}$ of the fuel cell 100 with respect to the total electric energy demand Pd of the electric vehicle. In addition, the electric energy distribution circuit 500 performs electric energy distribution between the fuel cell 100 and the lithium battery 200 according to the predefined ratio α, so that the ratio of the output power $P_{fc}$ of the fuel cell 100 to the output power Pb of the lithium battery 200 may satisfy the predefined ratio β.

Next, in the respective step S506, step S508 and step S510, the voltage decay state-of-health $SOH_V$, total power amount state-of-health $SOH_E$ and hydrogen consumption change state-of-health $SOH_H$ of the fuel cell 100 are calculated by the first calculating circuit 310, the second calculating circuit 320 and the third calculating circuit 330 of the first SOH calculating circuit 300, respectively.

Next, in step S512, the overall state-of-health $SOH_{fc}$ of the fuel cell 100 is calculated according to the voltage decay state-of-health $SOH_V$, the total power amount state-of-health $SOH_E$ and the hydrogen consumption change state-of-health $SOH_H$.

Figure 5B:
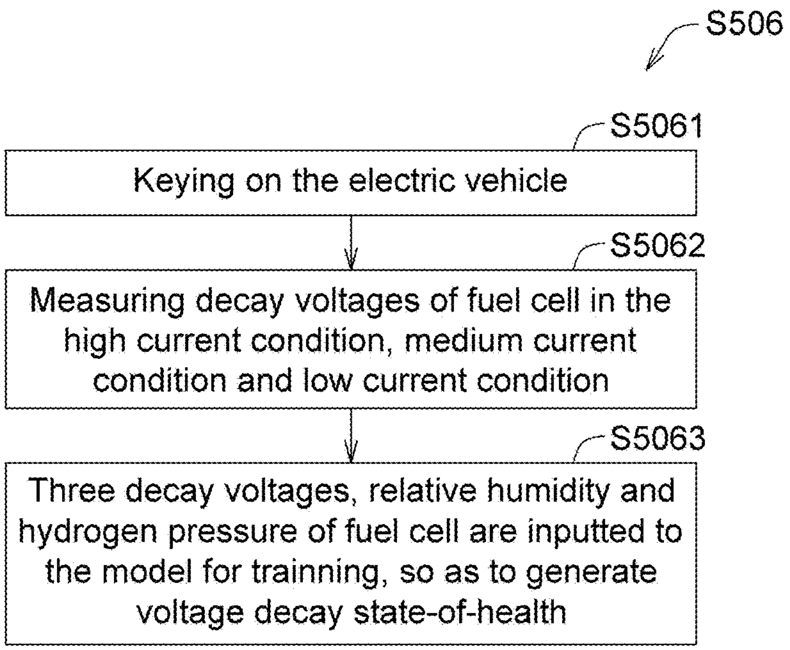
FIG. 5B is a detailed flow diagram of step S506 in FIG. 5A.

FIG. 5B is a detailed flow diagram of step S506 in FIG. 5A. As shown in FIG. 5B, firstly, step S5061 is executed: the electric vehicle is started (i.e., keying on). Then, step S5062 is executed: the decay voltage ΔV1 of the fuel cell 100 in the high current condition is measured by the first voltage measuring circuit 311, the decay voltage ΔV2 of the fuel cell 100 in the medium current condition is measured by the second voltage measuring circuit 312, and the decay voltage ΔV3 of the fuel cell 100 in the low current condition is measured by the third voltage measuring circuit 313. Then, step S5063 is executed: the decay voltage ΔV1, the decay voltage ΔV2, the decay voltage ΔV3, the hydrogen pressure PR and the relative humidity RH of the fuel cell 100 are inputted into the computational model 316 for training.

Furthermore, the computational model 316 outputs the voltage decay state-of-health $SOH_V$ of the fuel cell 100 at the current time point t.

Figure 5C:
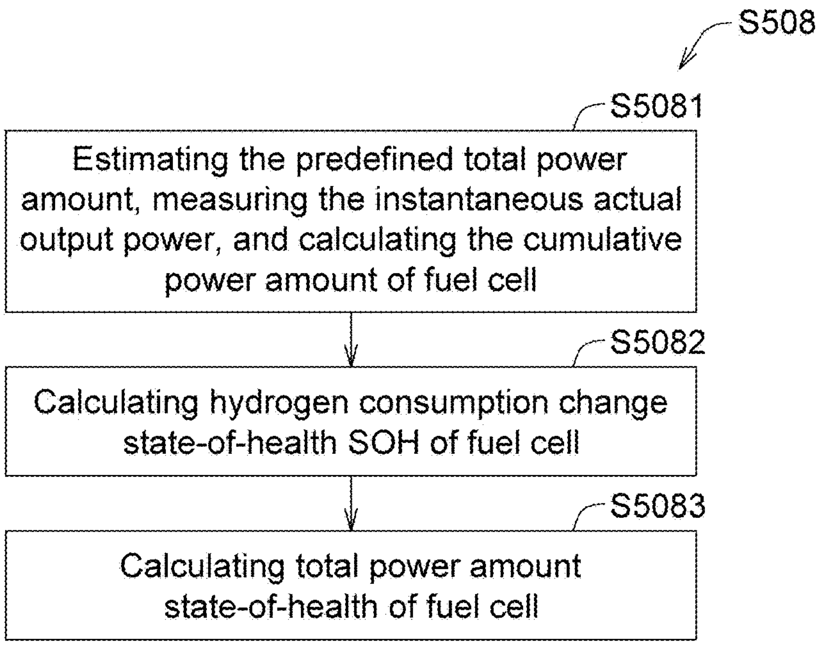
FIG. 5C is a detailed flow diagram of step S508 in FIG. 5A.

FIG. 5C is a detailed flow diagram of step S508 in FIG. 5A. As shown in FIG. 5C, firstly, step S5081 is executed: the predefined total power amount $E_{tol}$ of the fuel cell 100 is estimated by the second calculating circuit 320, the instantaneous actual output power $P_{fc(t)}$ of the fuel cell 100 is measured, and the cumulative power amount E(t1) of the fuel cell 100 is calculated. Then, step S5082 is executed: the predefined total power amount $E_{tol}$ of the fuel cell 100 is compared with the cumulative power amount E(t1) by the second calculating circuit 320. Then, step S5083 is executed: the total power amount state-of-health $SOH_E$ of the fuel cell 100 is calculated by the second calculating circuit 320.

Figure 5D:
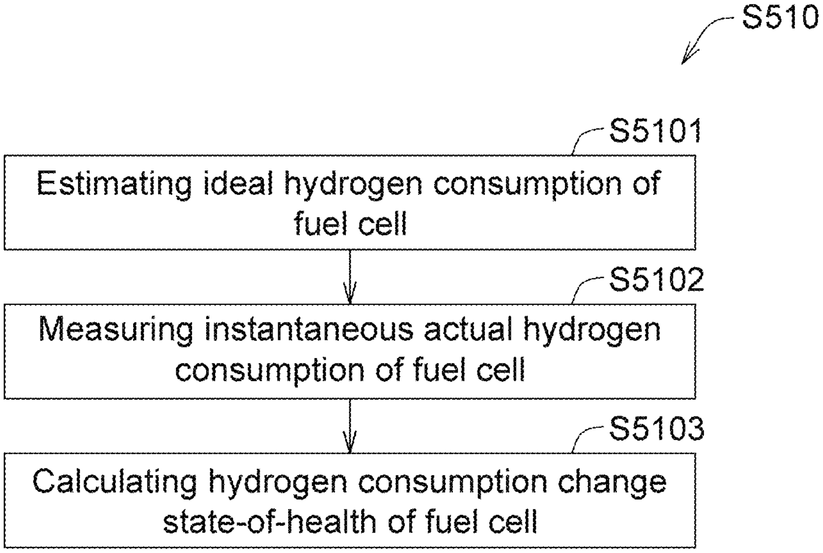
FIG. 5D is a detailed flow diagram of step S510 in FIG. 5A.

FIG. 5D is a detailed flow diagram of step S510 in FIG. 5A. As shown in FIG. 5D, firstly, step S5101 is executed: the third calculating circuit 330 estimates the ideal hydrogen consumption $H_{0(t)}$ of the fuel cell 100. Then, step S5102 is executed: the third calculating circuit 330 measures the instantaneous actual hydrogen consumption $H_{a(t)}$ of the fuel cell 100. For example, when the electric vehicle is being charged with hydrogen, the third calculating circuit 330 obtains the information about hydrogen charging amount of the electric vehicle, and calculates the actual hydrogen consumption $H_{a(t)}$ accordingly. Then, step S5103 is executed: the third calculating circuit 330 calculates the hydrogen consumption change state-of-health $SOH_H$ of the fuel cell 100.

It will be apparent to those skilled in the art that various modifications and changes can be made to the disclosed embodiments. It is intended that the specification and examples be considered as exemplars only, with a true scope of the disclosure being indicated by the following claims and their equivalents.

What is claimed is:

1. An electric energy managing system applied to an electric vehicle, comprising:

a first state-of-health (SOH) calculating circuit, for calculating an overall SOH of a fuel cell of the electric vehicle, wherein the overall SOH is associated with an aging condition of the fuel cell, the first SOH calculating circuit comprising:

a first calculating circuit, for calculating a voltage decay SOH of the fuel cell according to an ideal voltage and an actual voltage;

a second calculating circuit, for calculating a total power amount SOH of the fuel cell according to a predefined total power amount and a cumulative power amount;

a third calculating circuit, for calculating a hydrogen consumption change SOH of the fuel cell according to an ideal hydrogen consumption and an actual hydrogen consumption; and a weight calculating circuit, for performing a weight operation on the voltage decay SOH, the total power amount SOH and the hydrogen consumption change SOH, so as to obtain the overall SOH of the fuel cell, a second SOH calculating circuit, for calculating a SOH of a lithium battery of the electric vehicle, wherein the SOH is associated with an aging condition of the lithium battery; and an electric energy distribution circuit, for calculating a first predefined ratio of an output power of the fuel cell with respect to a total electric energy demand of the electric vehicle according to the overall SOH of the fuel cell and the SOH of the lithium battery, and controlling a second predefined ratio of the output power of the fuel cell with respect to an output power of the lithium battery according to the first predefined ratio.

2. The electric energy managing system of claim 1, wherein the first calculating circuit performs a two-dimensional table lookup according to a current-voltage characteristic curve of the fuel cell related to a change in the SOH, so as to obtain the actual voltage.

3. The electric energy managing system of claim 1, wherein the first computing circuit comprising:

a first voltage measuring circuit, for measuring a first decay voltage of the fuel cell in a high current condition;

a second voltage measuring circuit, for measuring a second decay voltage of the fuel cell in a medium current condition;

a third voltage measuring circuit, for measuring a third decay voltage of the fuel cell in a low current condition;

a pressure measuring circuit, for measuring a hydrogen pressure of the fuel cell; and a humidity measuring circuit, for measuring a relative humidity of the fuel cell, wherein, the first decay voltage, the second decay voltage and the third decay voltage correspond to the actual voltage.

4. The electric energy managing system of claim 3, wherein the first computing circuit further comprising:

a computational model, having a back-propagation neural network architecture, comprising:

an input layer, for receiving the first decay voltage, the second decay voltage, the third decay voltage, the hydrogen pressure and the relative humidity;

an intermediate layer, for performing an inference operation to obtain the voltage decay SOH; and an output layer, for outputting the voltage decay SOH.

5. The electric energy managing system of claim 1, wherein the third calculating circuit obtains a hydrogen consumption change of the fuel cell when the electric vehicle is charging with hydrogen, and performs a two-dimensional table lookup according to a hydrogen consumption change curve of the fuel cell related to a change in the SOH, so as to obtain the actual hydrogen consumption.

6. The electric energy managing system of claim 1, wherein the weight calculating circuit performs the weight operation according to a voltage decay SOH weight, a total power amount SOH weight and a hydrogen consumption change SOH weight, and the voltage decay SOH weight is greater than the total power amount SOH weight and the hydrogen consumption change SOH weight.

7. The electric energy managing system of claim 1, wherein the electric energy distribution circuit performs a global search algorithm (GSA) according to an objective function to calculate the first predefined ratio, and the value of the objective function is associated with a minimum value of a sum of the output power of the fuel cell and the output power of the lithium battery.

8. The electric energy managing system of claim 7, wherein the output power of the fuel cell is proportional to a product of a discharging output power of the fuel cell and a discharging penalty weight of the fuel cell.

9. The electric energy managing system of claim 7, wherein the output power of the lithium battery comprises a first component and a second component, the first component is proportional to a product of a charging output power of the lithium battery and a charging penalty weight of the lithium battery, and the second component is proportional to a product of a discharging output power of the lithium battery and a discharging penalty weight of the lithium battery.

10. An electric energy managing method applied to an electric vehicle, comprising:

calculating an overall SOH of a fuel cell of the electric vehicle, comprising:

calculating a voltage decay SOH of the fuel cell according to an ideal voltage and an actual voltage;

calculating a total power amount SOH of the fuel cell according to a predefined total power amount and a cumulative power amount;

calculating a hydrogen consumption change SOH of the fuel cell according to an ideal hydrogen consumption and an actual hydrogen consumption; and performing a weight operation on the voltage decay SOH, the total power amount SOH and the hydrogen consumption change SOH, so as to obtain the overall SOH of the fuel cell, wherein the overall SOH is associated with an aging condition of the fuel cell;

calculating a SOH of a lithium battery of the electric vehicle, wherein the SOH is associated with an aging condition of the lithium battery;

calculating a first predefined ratio of an output power of the fuel cell with respect to a total electric energy demand of the electric vehicle according to the overall SOH of the fuel cell and the SOH of the lithium battery; and controlling a second predefined ratio of the output power of the fuel cell with respect to an output power of the lithium battery according to the first predefined ratio.

11. The electric energy managing method of claim 10, wherein in the step of calculating the voltage decay SOH according to the ideal voltage and the actual voltage, a two-dimensional table lookup is performed according to a current-voltage characteristic curve of the fuel cell related to a change in the SOH, so as to obtain the actual voltage.

12. The electric energy managing method of claim 10, wherein the step of calculating the voltage decay SOH according to the ideal voltage and the actual voltage comprising:

measuring a first decay voltage of the fuel cell in a high current condition;

measuring a second decay voltage of the fuel cell in a medium current condition;

measuring a third decay voltage of the fuel cell in a low current condition;

measuring a hydrogen pressure of the fuel cell; and measuring a relative humidity of the fuel cell, wherein, the first decay voltage, the second decay voltage and the third decay voltage correspond to the actual voltage.

13. The electric energy managing method of claim 12, wherein the voltage decay SOH is obtained by executing the following steps through a computational model:

receiving the first decay voltage, the second decay voltage, the third decay voltage, the hydrogen pressure and the relative humidity through an input layer of the computational model;

performing an inference operation to obtain the voltage decay SOH through an intermediate layer of the computational model; and outputting the voltage decay SOH through a output layer of the computational model, wherein, the input layer, the intermediate layer and the output layer of the computational model form a back-propagation neural network architecture.

14. The electric energy managing method of claim 10, wherein the step of calculating the hydrogen consumption change SOH according to the ideal hydrogen consumption and the actual hydrogen consumption comprising:

when the electric vehicle is charging with hydrogen, obtaining a hydrogen consumption change of the fuel cell, performing a two-dimensional table lookup according to a hydrogen consumption change curve of the fuel cell related to a change in the SOH, so as to obtain the actual hydrogen consumption.

15. The electric energy managing method of claim 10, wherein the step of performing the weight operation on the voltage decay SOH, the total power amount SOH and the hydrogen consumption change SOH comprising:

performing the weight operation according to a voltage decay SOH weight, a total power amount SOH weight and a hydrogen consumption change SOH weight;

wherein, the voltage decay SOH weight is greater than the total power amount SOH weight and the hydrogen consumption change SOH weight.

16. The electric energy managing method of claim 10, wherein the step of calculating the first predefined ratio of the output power of the fuel cell with respect to the total electric energy demand of the electric vehicle comprising:

performing a global search algorithm (GSA) according to an objective function to calculate the first predefined ratio;

wherein, the value of the objective function is associated with a minimum value of a sum of the output power of the fuel cell and the output power of the lithium battery.

17. The electric energy managing method of claim 16, wherein the output power of the fuel cell is proportional to a product of a discharging output power of the fuel cell and a discharging penalty weight of the fuel cell.

18. The electric energy managing method of claim 16, wherein the output power of the lithium battery comprises a first component and a second component, the first component is proportional to a product of a charging output power of the lithium battery and a charging penalty weight of the lithium battery, and the second component is proportional to a product of a discharging output power of the lithium battery and a discharging penalty weight of the lithium battery.

* * * * *